(12) United States Patent
Bonart et al.

(10) Patent No.: US 7,034,358 B2
(45) Date of Patent: Apr. 25, 2006

(54) VERTICAL TRANSISTOR, AND A METHOD FOR PRODUCING A VERTICAL TRANSISTOR

(75) Inventors: Dietrich Bonart, Bad Abbach (DE); Gerhard Enders, Olching (DE); Peter Voigt, Hallbergmoos (DE)

(73) Assignee: Infineon Technologies AG, Munich (DE)

( * ) Notice: Subject to any disclaimer, the term of this patent is extended or adjusted under 35 U.S.C. 154(b) by 63 days.

(21) Appl. No.: 10/615,567

(22) Filed: Jul. 8, 2003

(65) Prior Publication Data

US 2004/0005762 A1 Jan. 8, 2004

(30) Foreign Application Priority Data

Jul. 8, 2002 (DE) ................................ 102 30 715

(51) Int. Cl.
*H01L 21/336* (2006.01)
*H01L 29/78* (2006.01)

(52) U.S. Cl. ............... 257/330; 257/332; 257/E29.112; 257/E29.131; 438/270; 438/589

(58) Field of Classification Search ................ 257/329, 257/330, 331, 332, 263, 302, E29.112, E29.131, 257/E29.134, E21.411, E29.273; 438/156, 438/365, 595, 596, 268, 270, 212, 589
See application file for complete search history.

(56) References Cited

U.S. PATENT DOCUMENTS

| 4,954,854 A | * | 9/1990 | Dhong et al. ................ 257/332 |
| 5,365,097 A | | 11/1994 | Kenney |
| 5,404,038 A | * | 4/1995 | Morihara .................... 257/329 |
| 5,434,435 A | * | 7/1995 | Baliga ........................ 257/141 |
| 5,744,386 A | | 4/1998 | Kenney |
| 5,763,310 A | * | 6/1998 | Gardner ...................... 438/270 |
| 5,940,707 A | * | 8/1999 | Gardner et al. ............. 438/270 |
| 6,015,725 A | * | 1/2000 | Hirayama ................... 438/156 |
| 6,093,614 A | | 7/2000 | Gruening et al. |
| 6,184,151 B1 | | 2/2001 | Adair et al. |
| 6,436,770 B1 | * | 8/2002 | Leung et al. ............... 438/268 |

(Continued)

FOREIGN PATENT DOCUMENTS

DE       100 11 889 A1     9/2001

(Continued)

OTHER PUBLICATIONS

Gibilisco, Stan, Editor-in-Chief; The Illustrated Dictionary of Electronics, Eighth Edition; New York, NY: McGraw-Hill, p. 310, 2001.*

Graf, Rudolf F.; Modern Dictionary of Electronics, Seventh Edition; Boston, MA: Newnew, pp. 317-318, 1999.*

*Primary Examiner*—M. Wilczewski
(74) *Attorney, Agent, or Firm*—Laurence A. Greenberg; Werner H. Stemer; Ralph E. Locher

(57) ABSTRACT

The present invention relates to a method for producing a vertical transistor, and to a vertical transistor. A sacrificial gate oxide and a sacrificial gate electrode are used during the production of the vertical transistor to makes it possible to considerably reduce or entirely avoid negative effects that normally result from the production of insulation structures between the vertical transistors. In particular, broadening of the gate oxide at the edge of the gate electrode can be prevented, and the edge of the gate electrode can be influenced deliberately. This allows vertical transistors to be produced having a current/voltage characteristic that can be adjusted specifically. In particular, vertical transistors can be produced having a pronounced corner effect.

20 Claims, 9 Drawing Sheets

U.S. PATENT DOCUMENTS

| | | | |
|---|---|---|---|
| 6,455,377 B1 * | 9/2002 | Zheng et al. | 438/268 |
| 6,525,403 B1 * | 2/2003 | Inaba et al. | 257/618 |
| 6,770,534 B1 * | 8/2004 | Cho et al. | 438/268 |
| 2001/0030337 A1 | 10/2001 | Weis | |
| 2001/0044190 A1 * | 11/2001 | Heo et al. | 438/270 |
| 2002/0098655 A1 * | 7/2002 | Zheng et al. | 438/268 |
| 2002/0102784 A1 * | 8/2002 | Lee et al. | 438/206 |

FOREIGN PATENT DOCUMENTS

| | | |
|---|---|---|
| EP | 1 030 362 A2 | 8/2000 |
| JP | 63-296281 | * 12/1988 |
| JP | 2-71556 | * 3/1990 |

* cited by examiner

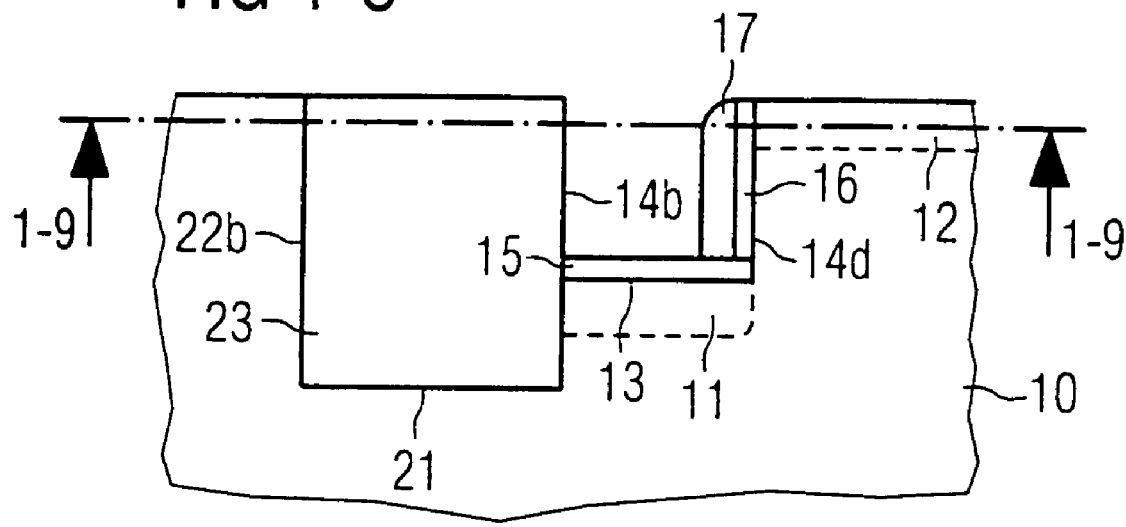
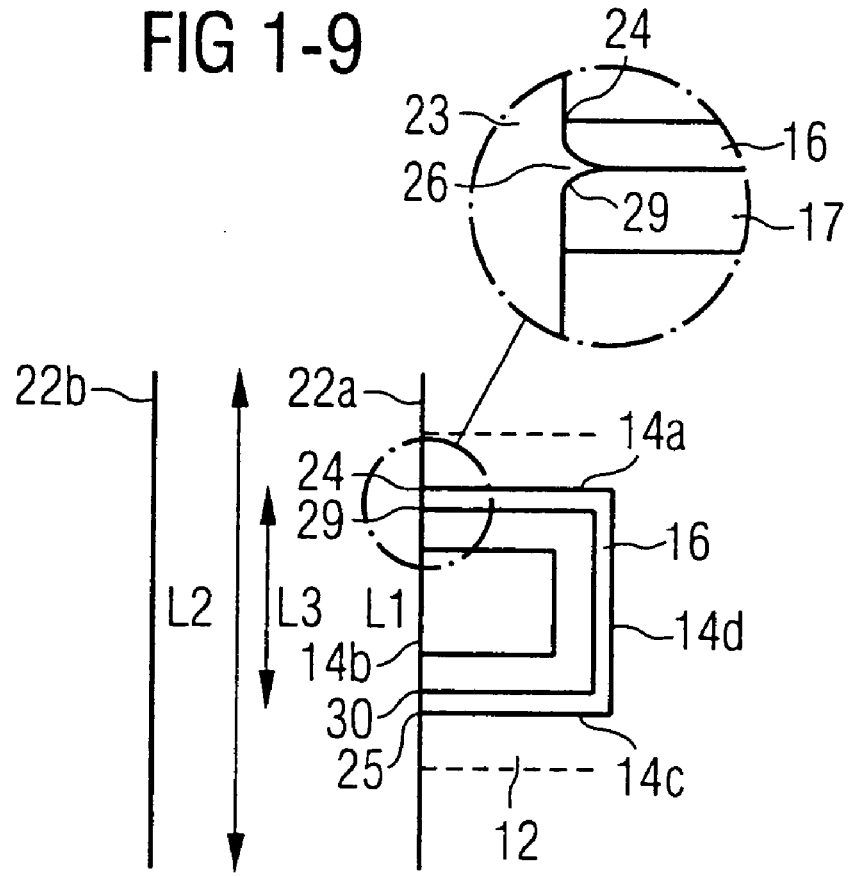

VERTICAL TRANSISTOR, AND A METHOD FOR PRODUCING A VERTICAL TRANSISTOR

BACKGROUND OF THE INVENTION

Field of the Invention

The invention relates to the field of semiconductor technology, and in particular, to the field of technology for semiconductor memories. The invention even more particularly relates to a vertical transistor and to a method for producing a vertical transistor.

Structure widths F (ground rules) of less than 100 nm will be used for future generations of semiconductor products. The expression, "a structure width" in this case means the minimum lithographically achievable resolution. With progressive improvements in the lithography methods that are used, increasingly smaller structure widths can be achieved although these pose ever more stringent requirements on the overall production process.

The increasing miniaturization of the structure widths in the case of dynamic semiconductor memories (DRAM) is leading to the expectation of a transition from planar selection transistors to vertical selection transistors, which may be integrated in the upper part of the trench capacitor. In the case of a vertical transistor and in contrast to a lateral transistor, the transistor channel runs in the vertical direction with respect to the main plane of the semiconductor substrate. This change in the arrangement of the energy storage capacitor and selection transistor is on the one hand governed by the physical-limits that occur for planar transistors with channel lengths of less than 100 nm. Such small channel lengths provide, for example, the risk of increased leakage currents. Furthermore, the small cross section of the channel limits the magnitude of the maximum current that can flow. On the other hand, the change to a vertical cell concept takes account of the desire to achieve memory cells that are as compact as possible, that is to say, memory cells whose lateral extent is small.

A further problem which leads to the appearance of the desirability of changing to vertical cell concepts is the need to form the selection transistor from the connection (buried strap) of the inner electrode of the trench capacitor, since this connection has a certain extent because of the outward diffusion of dopants, thus intrinsically providing the risk of crosstalk between adjacent memory cells. Furthermore, memory cells with a vertical transistor have the major advantage that the channel length of the selection transistor in them can be set independently of the structure width F that is used. Methods for producing a vertical transistor in a trench are described, for example, in U.S. Pat. No. 6,093,614 and in U.S. Pat. No. 5,365,097. In both methods, an epitaxial semiconductor layer is deposited on one sidewall of the capacitor trench, in order to form the vertically running channel region. Outward diffusion of dopants from the trench, which is filled with doped polysilicon, results in a drain region in the epitaxial semiconductor layer.

One problem with regard to the design of vertical transistors is the production of transistors with a satisfactory current/voltage characteristic, in particular in the area of the transistor threshold. It is desirable to have transistors whose so-called OFF current is as small as possible. This means that, when the gate of the transistor has a blocking voltage applied, it shall be as completely closed as possible and as much as possible should not have any leakage currents which, for example, could lead to a creeping discharge from the energy storage capacitor which is connected to that transistor. In the case of memory cells, the discharge time when the capacitor is in the closed state should be as long as possible in order to make it possible to avoid frequent recharging of the energy storage capacitors (refreshing). Furthermore, it is desirable to have transistors which have an ON current which is as large as possible, in order that the energy storage capacitor can be charged and discharged sufficiently quickly.

Furthermore, in the region of the transistor threshold, the current level in the transistor should decrease as quickly as possible as the voltage on the gate decreases. This current/voltage characteristic is also referred to as the sub-threshold slope. When the current/voltage curve in the region of the threshold value has a gradient which is as steep as possible, this means that the voltage range which separates the closed state of the transistor from the open state is small, so that the transistor can be opened or closed by just a minor change in the gate voltage. Since a large number of transistors are generally controlled by a common gate path in integrated circuits, it is also important for this gate path to have a current/voltage characteristic which is as standard as possible.

SUMMARY OF THE INVENTION

It is accordingly an object of the invention to provide a vertical transistor and a method for producing a vertical transistor, which overcome the above-mentioned disadvantages of the prior art apparatus and methods of this general type. In particular, it is an object of the invention to provide a vertical transistor which has a satisfactory current/voltage characteristic.

With the foregoing and other objects in view there is provided, in accordance with the invention, a method for producing a vertical transistor having a gate electrode, a gate oxide, an upper source/drain region, and a lower source/drain region. The method include steps of: producing at least one first trench in a substrate; producing a sacrificial gate oxide on at least a first trench wall; producing a sacrificial gate electrode on the sacrificial gate oxide; producing an insulation structure for insulation between different vertical transistors; removing the sacrificial gate electrode from the trench; removing the sacrificial gate oxide from the trench; at least at a location of the sacrificial gate oxide, producing the gate oxide on the trench wall; producing the gate electrode on the gate oxide; and producing the upper source/drain region and the lower source/drain region.

With the foregoing and other objects in view there is also provided, in accordance with the invention, a vertical transistor including: at least one trench wall; a plurality of source/drain regions; a channel region running essentially vertically on the trench wall; a gate electrode; a gate oxide insulating the gate electrode from the channel region; and at least one insulation structure for insulating between different vertical transistors. The insulation structure bounds the gate electrode. The gate electrode has an internal angle α of 90° or less with the insulation structure.

For the purposes of the present invention, it has been found that the conventional production of vertical transistors at the gate edge generally results in broadening of the gate oxide, frequently in the form of what is referred to as a bird's beak. This broadening is evident, for example, as a side effect of the production of trench insulation in the immediate vicinity of the vertical transistor. During the thermal oxidation which is normally carried out during the production of trench insulation, the gate is likewise partially oxidized on the boundary surface between the gate and the gate oxide, as a result of which the gate oxide is broadened in this area, with the broadening decreasing as the distance from the trench edge increases, thus forming a structure which is similar to a bird's beak in the gate oxide.

Formation of the bird's beak leads to rounding of the edge of the gate, which is defined by the trench edge, the gate and the gate oxide.

Such edge rounding at the gate is often regarded as being desirable in conventional, horizontally aligned transistors since this avoids what are referred to as corner effects, which are produced by increasing the electrical field strength in the region of the edge of the gate and may have a disadvantageous effect on the characteristics of a transistor. The idea on which the present invention is based is the avoidance of corresponding broadening and the production of a vertical transistor with corner effects.

The use of a sacrificial gate oxide and of a sacrificial gate electrode makes it possible to considerably reduce or entirely avoid negative effects which normally result from the production of insulation structures between the vertical transistors. In particular, it is possible to prevent broadening of the gate oxide of the edge of the gate electrode, and to deliberately influence the edge of the gate electrode. This makes it possible to produce vertical transistors with a deliberately adjustable current/voltage characteristic. In particular, it is possible to produce vertical transistors with a pronounced cornet effect.

For the purposes of the present invention, there is no need for the insulation structure to be produced completely before the sacrificial structures are removed. It is sufficient for major steps, or the steps which normally have effects on the gate electrode and/or the gate oxide to be carried out during the production of the insulation structure before the sacrificial structures are removed. Accordingly, these production steps act only on the sacrificial structures and not on the final structures, so that the component characteristic of the vertical transistor can be improved considerably.

There is also no need for all of the steps in the inventive method to be carried out in the stated sequence. For example, the source/drain regions may be at least partially formed even after the production of the trench. The lower source/drain region is preferably produced before the deposition of an insulation layer on the base of the first trench. Both the upper source/drain region and the lower source/drain region can be produced in the substrate by conventional doping methods.

The substrate in which the vertical transistor is structured is normally composed of silicon, which may be doped with boron, phosphorous or arsenic. Conventional etching methods, which are used for etching silicon, may be used to produce the first trench, in particular, chemical/physical dry etching methods. The shape of the basic outline of the trench may in this case be chosen as required.

In order to insulate the gate electrode from the lower source/drain region, a first insulation layer is preferably deposited onto the base of the trench. In one particular preferred variant of the method, the insulation layer is a silicon nitride layer. This has the advantage that this layer can be used as a mask for protection of the lower source/drain region during the subsequent removal of the sacrificial gate electrode and of the sacrificial gate oxide. Conventional methods such as CVD (Chemical Vapor Deposition) methods or thermal oxidation in an atmosphere containing ammonia my be used to produced the silicon nitride layer.

Both the sacrificial gate oxide and the gate oxide may be produced on the trench wall using conventional methods for producing thin oxide layers. In on particularly preferred embodiment of the present invention, the sacrificial gate oxide and/or the gate oxide are/is produced at least on the trench wall by using thermal oxidation. The production of the gate oxide and/or of the sacrificial gate oxide is also preferably carried out by deposition, preferably conformal deposition, of an oxide layer on at least the trench wall.

Any suitable electrically conductive material may be used as the material for using the sacrificial gate electrode and/or the gate electrode. It is particularly preferably to use polysilicon as the gate electrode material. In order to structure the sacrificial gate electrode and/or the gate electrode, the first trench may be filled completely or only partially with the gate electrode material. In a further particularly preferred embodiment of the method, polysilicon is used as the material for the sacrificial gate electrode and/or for the gate electrode. By way of example, the gate electrode may be produced by conformal deposition of polysilicon in the first trench, with subsequent anisotropic etching of the deposited polysilicon layer. Furthermore, the gate electrode may be formed from different layers of materials, for example, from a polysilicon layer on which a metal layer, for example, a tungsten layer, is applied, and which can be isolated from the polysilicon by a barrier layer, for example, a tungsten nitride layer.

According to one preferred embodiment of the present invention, trench insulation is used as the insulation structure. A second trench is preferably produced for this purpose. The second trench, in which the trench insulation is produced, may be produced immediately adjacent to one trench wall of the first trench, or such that it overlaps the first trench. Conventional lithography and etching methods may be used for producing the second trench. In order to produce the second trench, a mask is preferably deposited and structured on the substrate, and the second trench is then etched by a chemical/physical dry etching method.

The trench insulation is then produced, for its purpose the base and the walls of the second trench are thermally oxidized in a first step. In the course of this thermal oxidation, the silicon of the substrate is oxidized starting from one source/drain edge at the boundary surface between the first trench wall and the sacrificial gate oxide, thus forming what is referred to as a bird's beak. This bird's beak has a negative effect on the current/voltage characteristic of the vertical transistor. The second trench is then filled with an insulating material, for example, silicon dioxide. In this case, a first trench insulation wall forms an edge with the first trench wall. Further steps for producing the trench insulation may then be carried out.

In order to avoid the negative influences of the bird's beak on the current/voltage characteristic, the sacrificial gate electrode and the sacrificial gate oxide are removed in the inventive method. Conventional methods may be used for this purpose. Chemical/physical dry etching methods are preferably used for removing the sacrificial gate electrode.

In one particularly preferred embodiment of the method, the sacrificial gate oxide is removed by isotropic etching. It is particularly preferable in this case for the sacrificial gate oxide to be removed by wet-chemical etching.

The subsequent production of the gate oxide is achieved by thermal oxidation in one preferred variant of the method. This oxidation results in the formation of an oxide layer, which forms the gate oxide, on the substrate on the exposed areas of the trench walls of the first trench.

The reproduction of the gate electrode and of the gate oxide after the thermal oxidation of the second trench results in it not having any bird's beak on its common boundary surface. The gate electrode produced using the method has a comparatively sharp, first gate electrode edge. In this case, it is particularly preferable for the first gate electrode edge to have an internal angle α of 90° or less. The internal angle α is in this case the angle with which the gate electrode, in particular the boundary surface between the gate electrode and the gate oxide, meets the edge of the gate electrode on the insulation structure. In comparison to conventionally structured gate electrodes, the gate electrode, which has been produced using the inventive method, has a pronounced corner effect.

In a further particularly preferred variant of the method, the insulating material of the trench insulation is removed in the area of the first trench insulation wall during the removal of the sacrificial gate oxide, so that at least one substrate edge is exposed. In this case, it is furthermore preferable for the exposed substrate edge then also to be covered by the gate oxide and/or the gate electrode. This results in corner effects occurring to an even more considerable extent.

If the insulating material is removed from the trench insulation by performing the isotropic etching as described above, then the gate electrode edge has a shape which runs in a particularly pointed manner, in which the corner effect is pronounced to a particularly major extent. The geometry and position of the gate electrode can be influenced by the duration of the isotropic etching process. If the etching time is correspondingly long, this results after structuring the gate electrode as a gate electrode that passes around the source/drain edge of the upper source/drain region, thus resulting in a particularly pronounced corner effect.

In one particularly preferred variant of the method, the vertical transistor is structured as part of a memory cell above an energy storage capacitor. It is particularly preferable for the vertical transistor to be structured as part of a DRAM memory cell.

Other features which are considered as characteristic for the invention are set forth in the appended claims.

Although the invention is illustrated and described herein as embodied in a vertical transistor, and a method for producing a vertical transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2-1 to 2-7 are cross-sectional views for illustrating a second embodiment of the method for producing a vertical transistor; and FIG. 3 is a graph of current/voltage curves for a vertical transistor produced using the inventive method and for a conventional vertical transistor.

DESCRIPTION OF THE PREFERRED EMBODIMENTS

Figure 1:
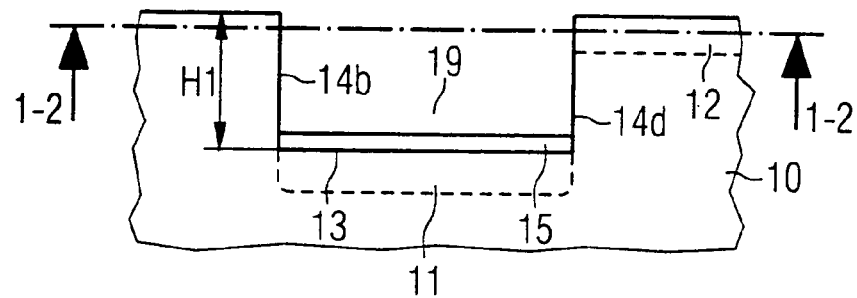
FIGS. 1-1 to 1-14 are cross-sectional views for illustrating a first embodiment of the method for producing a vertical transistor.

Referring now to the figures of the drawing in detail and first, particularly, to FIG. 1-1 thereof, there is shown a substrate 10, in which a first trench 19 has been produced using a chemical/physical dry etching method. The substrate 10 is, for example, monocrystalline silicon doped with boron. An insulation layer 15 composed of silicon nitride has been deposited on the trench base 13. The lower source/drain region 11 was produced in the substrate 10, underneath the trench base 13, by an appropriate doping process.

Figures 1, 2:
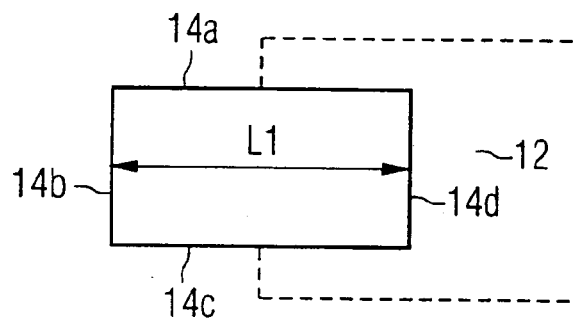

FIG. 1-2 shows a section through the substrate 10 along the dashed line 1-2 shown in FIG. 1-1. This view illustrates the rectangular basic outline of the first trench 19. In a corresponding way, the first trench 19 has a first trench wall 14a, a trench wall 14c opposite the first trench wall 14a, and further mutually opposite trench walls 14b and 14d. The first trench wall 14a has a length L1 and a height H1. As can be seen from FIG. 1-2, part of the first trench 19 projects into the upper source/drain region 12, which has already been produced in the substrate 10 by using an appropriate doping process. Alternatively, however, the relative position of the first trench 19 with respect to the upper source/drain region 12 could also be configured such that the first trench 19 is adjacent to the upper source/drain region only along its trench wall 14d.

Figures 1, 2, 3:
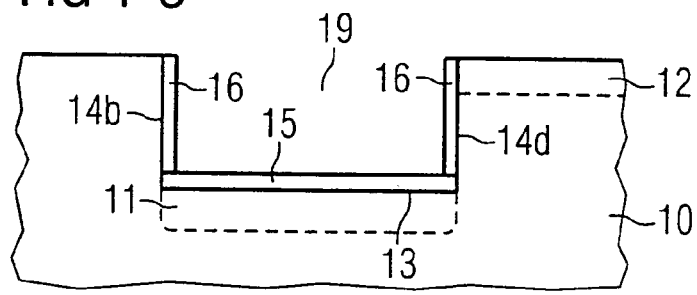
Figures 1, 2, 3, 4:
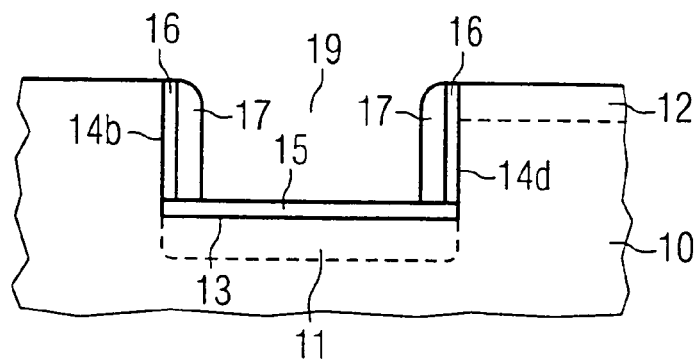
Figures 1, 2, 3, 4, 5:
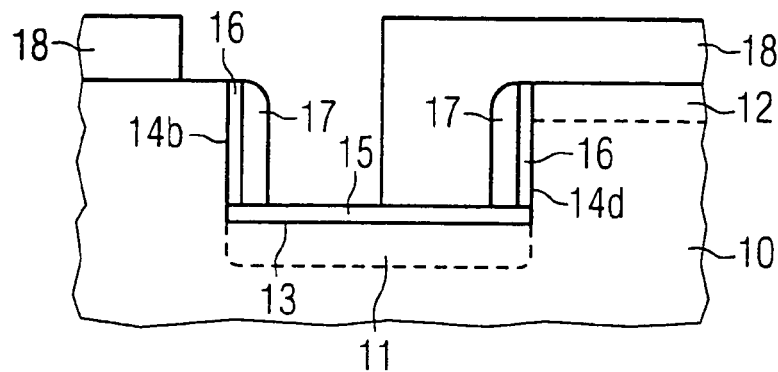
Figures 1, 2, 3, 4, 5, 6:
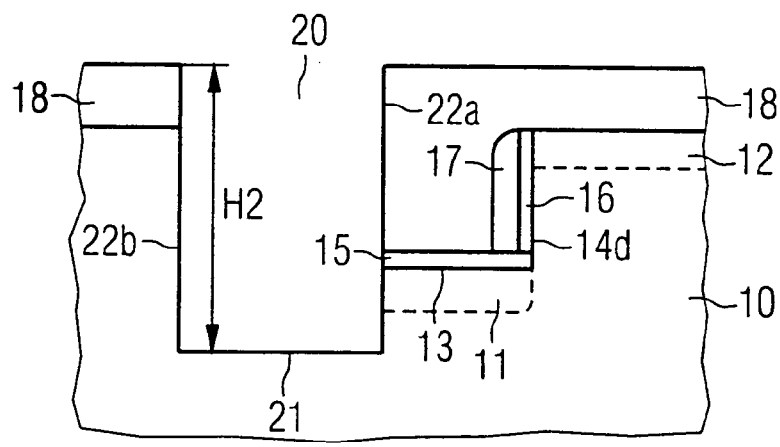
Figures 1, 2, 3, 4, 5, 6, 7:
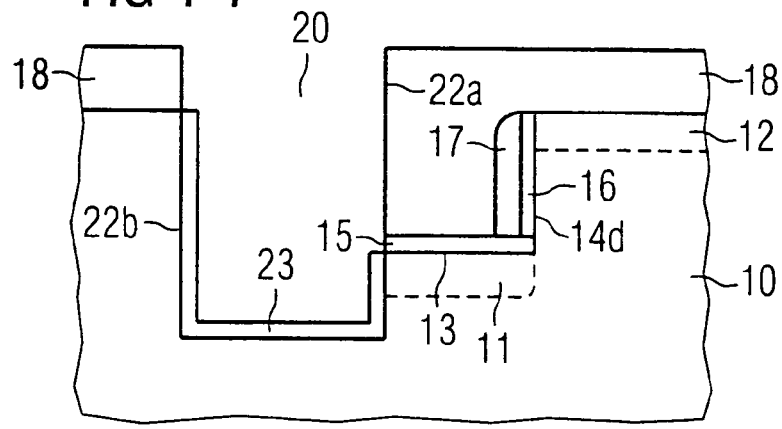
Figures 1, 2, 3, 4, 5, 6, 7, 8, 9, 10:
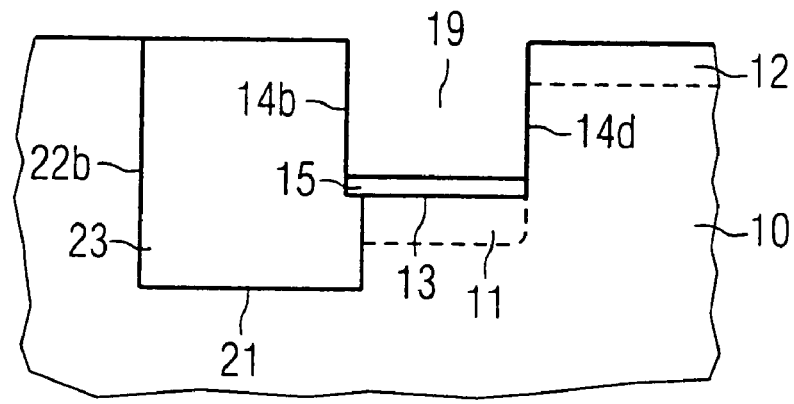
Figures 1, 2, 3, 4, 5, 6, 7, 8, 9, 10, 11:
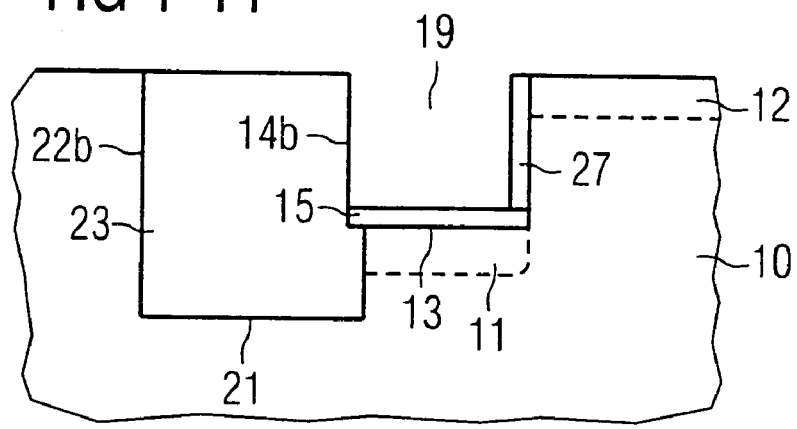
Figures 1, 2, 3, 4, 5, 6, 7, 8, 9, 10, 11, 12:
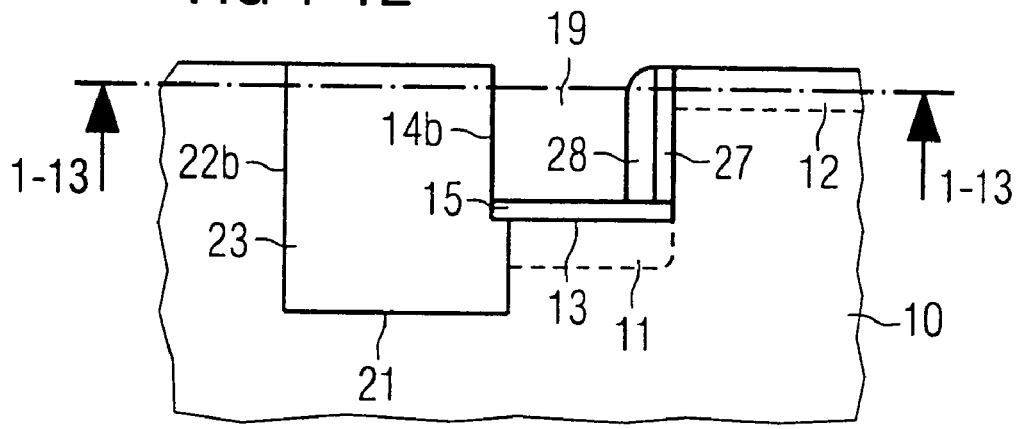
Figures 1, 2, 3, 4, 5, 6, 7, 8, 9, 10, 11, 12, 13:
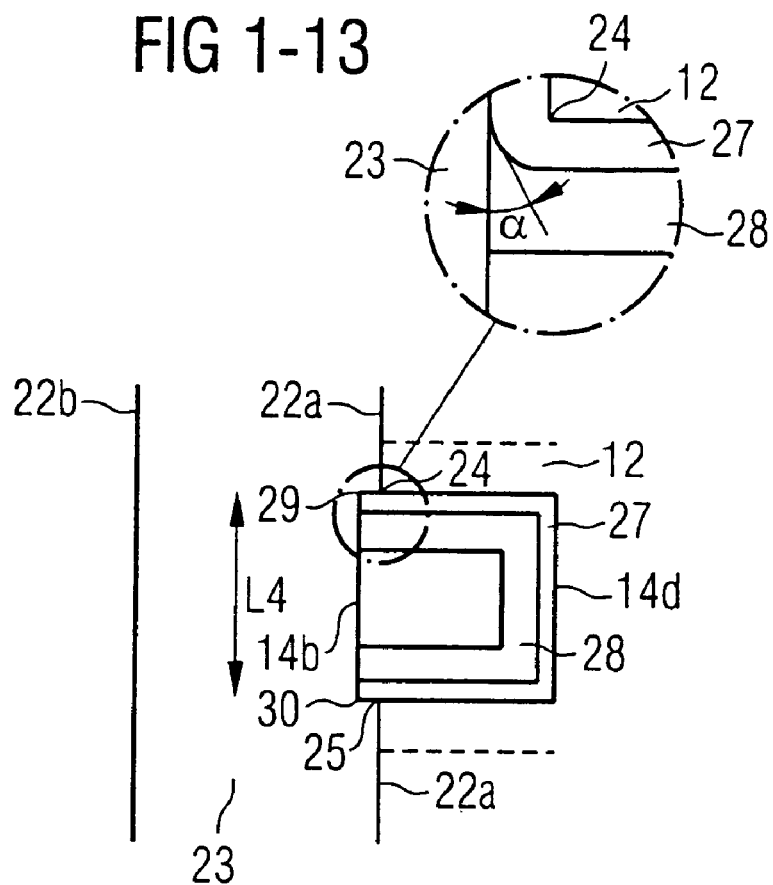
Figures 1, 2, 3, 4, 5, 6, 7, 8, 9, 10, 11, 12, 13, 14:
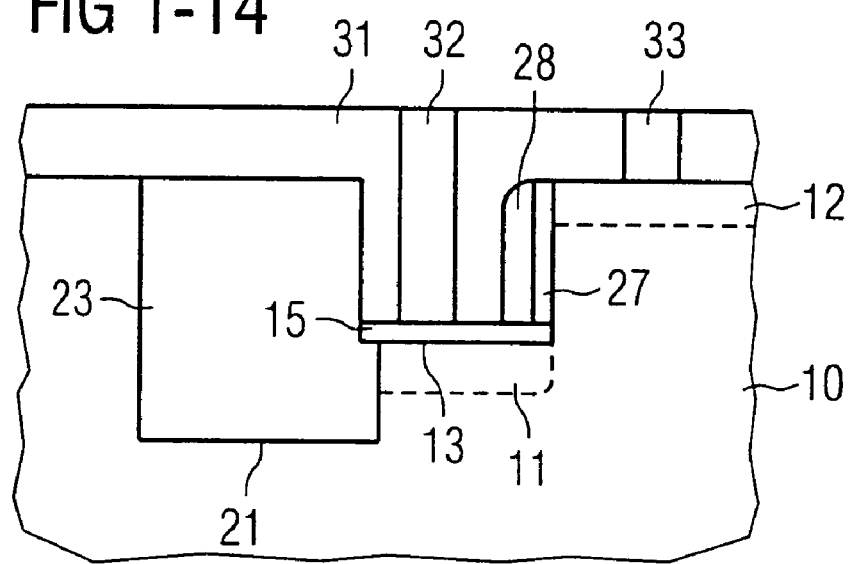
Figures 1, 2:
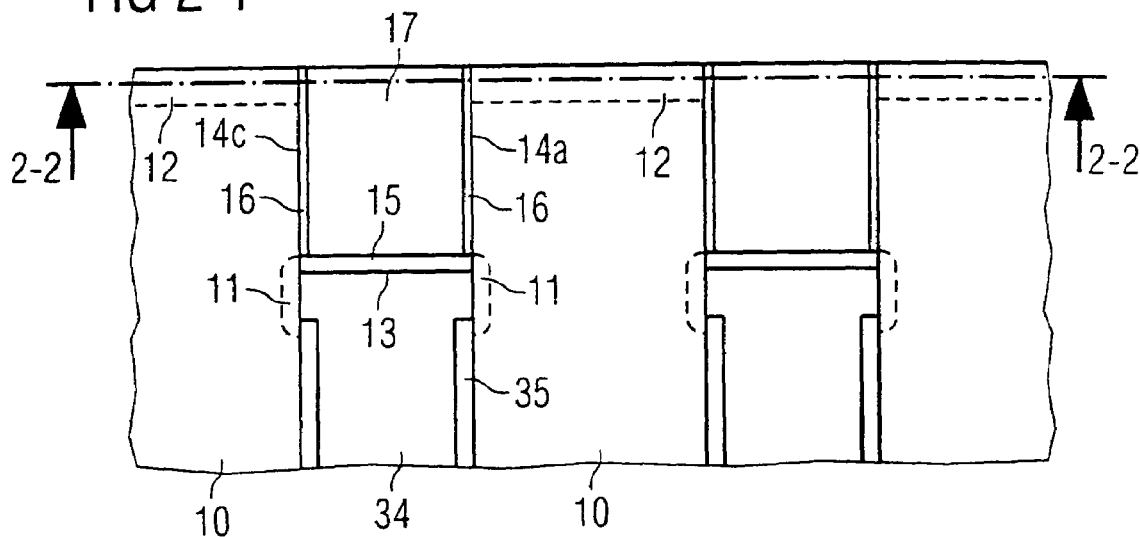
Figure 2:
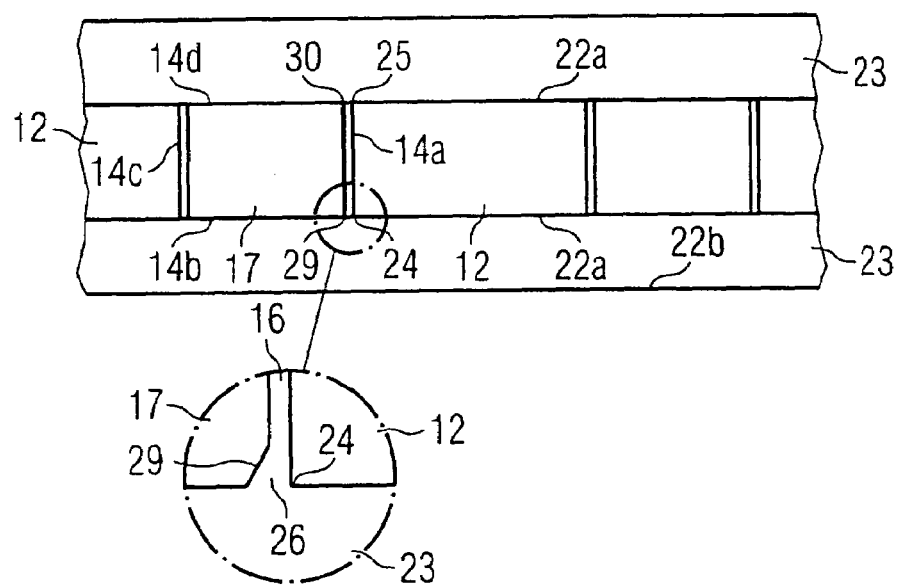
Figures 2, 3:
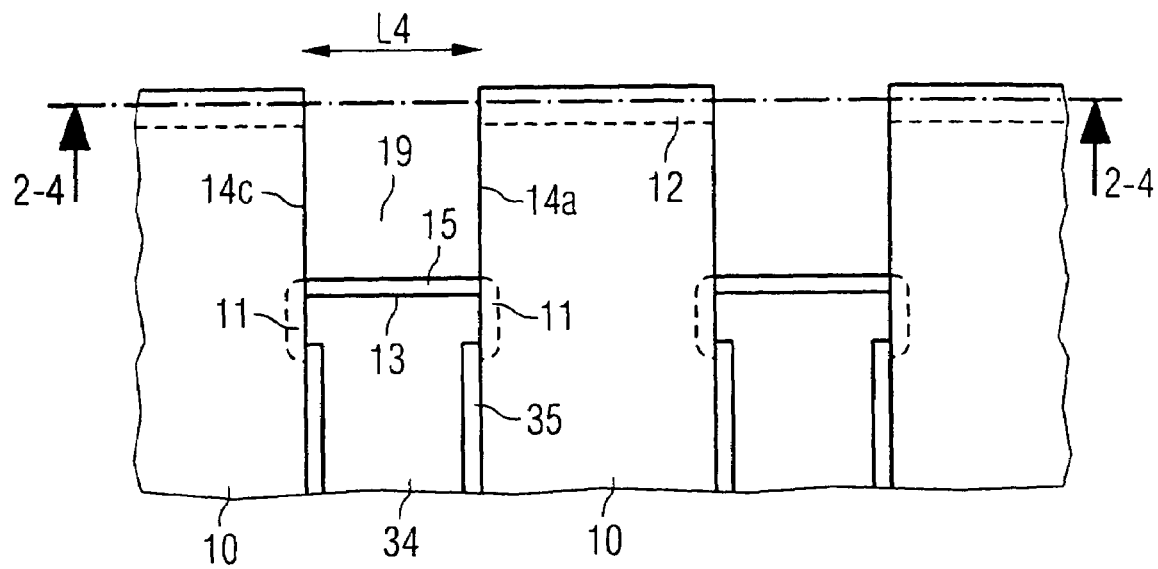
Figures 2, 3, 4:
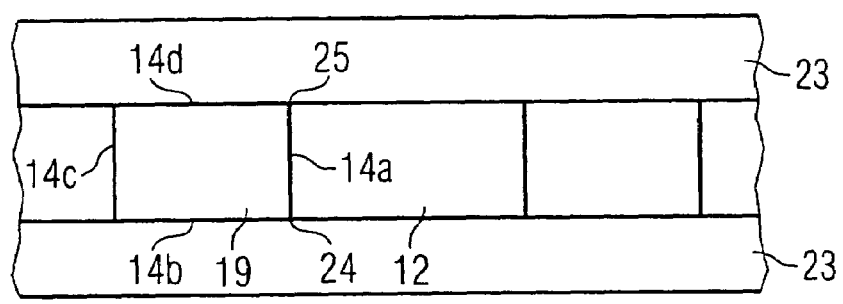
Figures 2, 3, 4, 5:
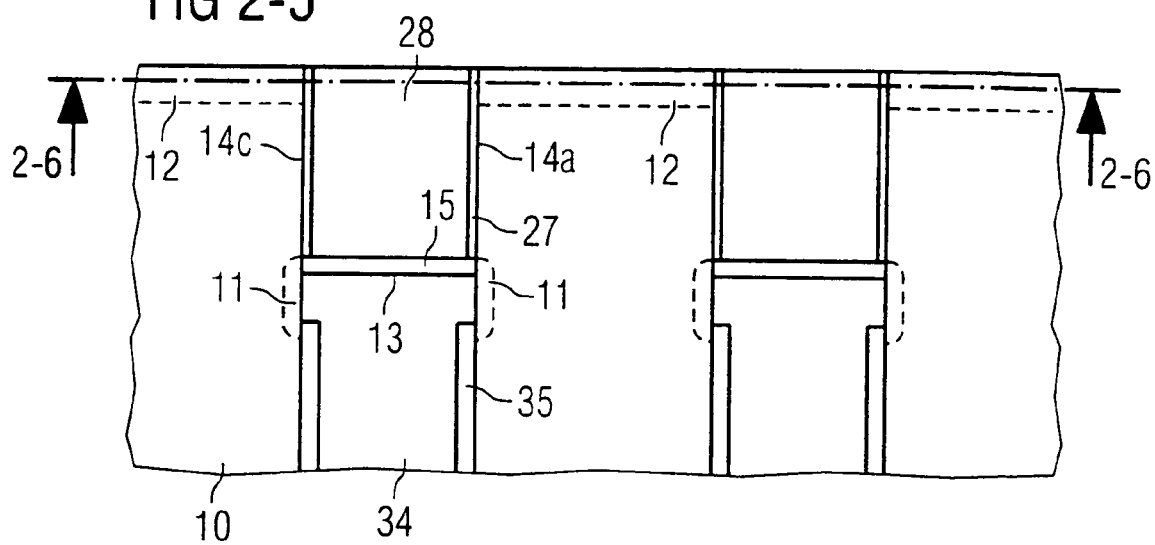
Figures 2, 3, 4, 5, 6:
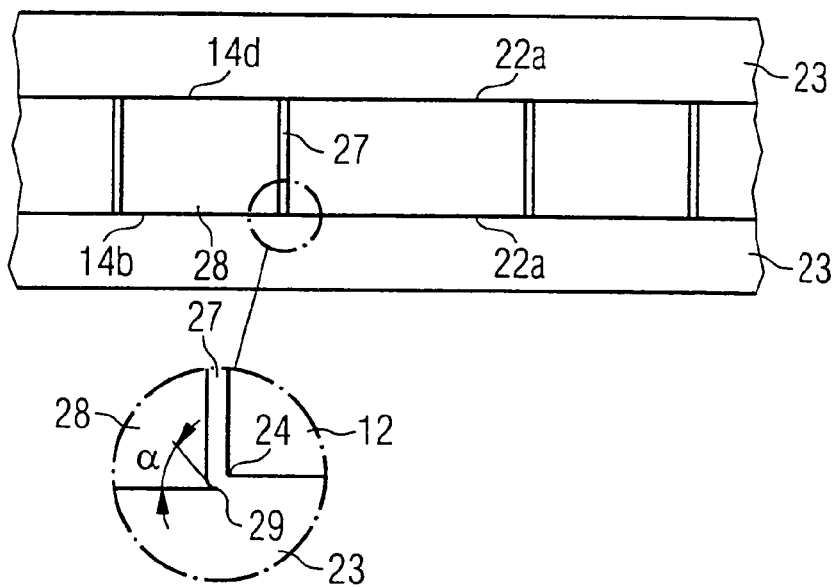
Figures 2, 3, 4, 5, 6, 7:
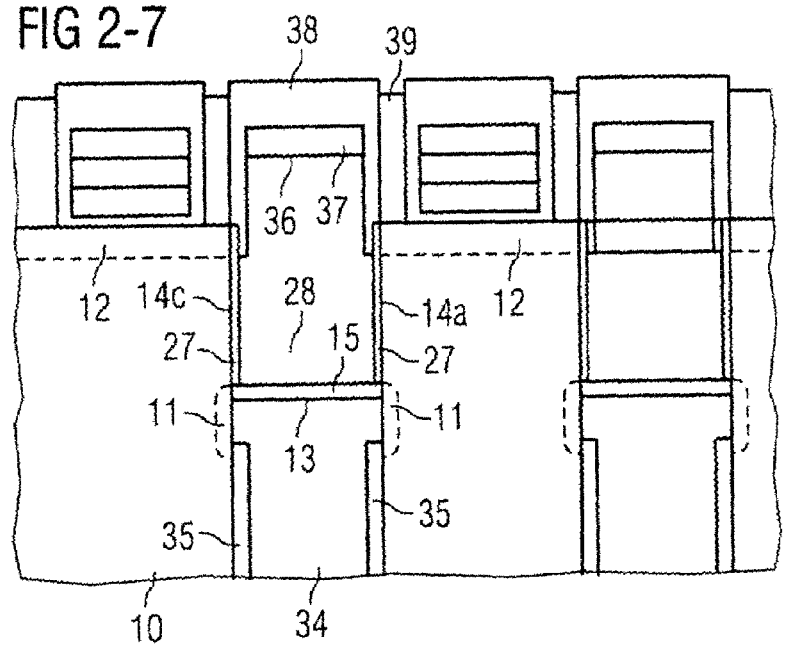
Figure 3:
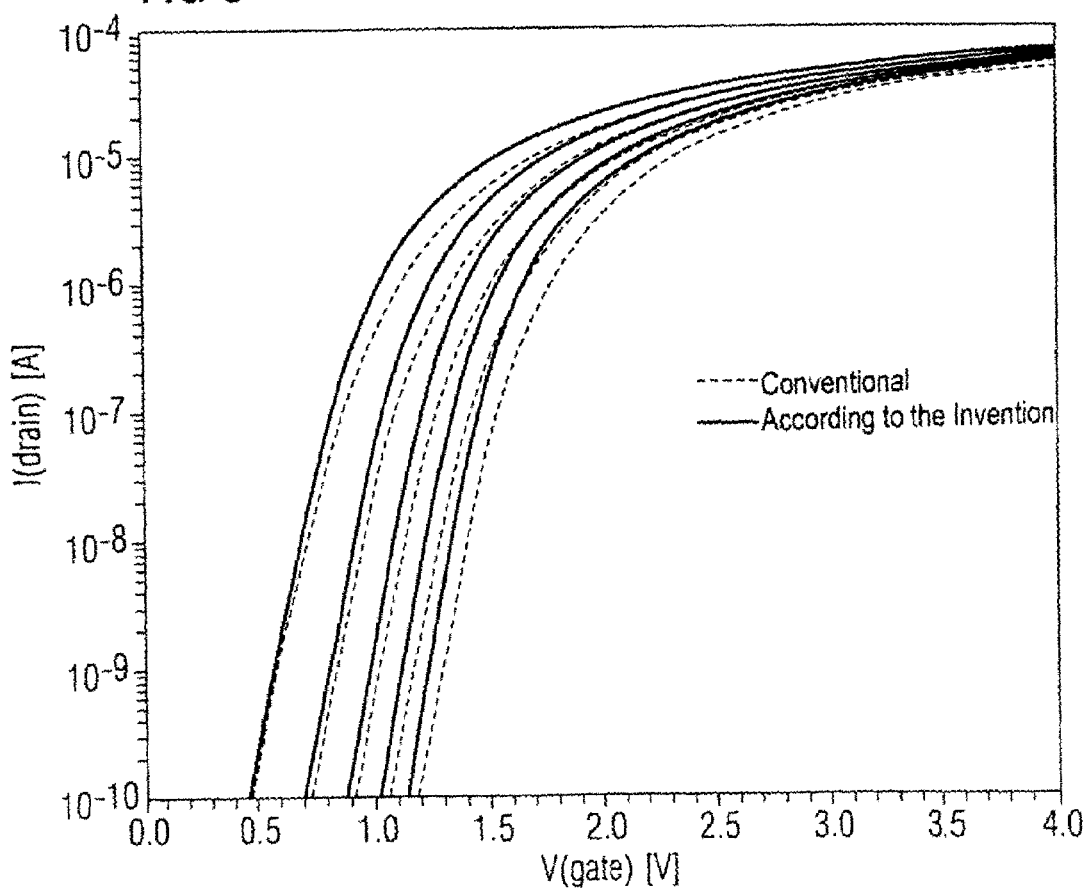

As is shown in FIG. 1-3, the sacrificial gate oxide 16 is then produced on the trench walls of the first trench 19 by thermal oxidation. In order to avoid oxidation of the substrate surface away from the first trench 19, it may be necessary to protect this substrate surface with an appropriate mask. This mask can then be removed after the production of the sacrificial gate oxide 16.

In a next step, which is shown in FIG. 1-4, the sacrificial gate electrode 17 is produced on the sacrificial gate oxide within the trench 19. This is done by the conformal deposition of a polysilicon layer on the substrate 10 and in the first trench 19 and by subsequent anisotropic etching of the polysilicon, which is thus removed selectively in the vertical areas of the substrate surface and of the trench base 13, and/or of the insulation layer 15. In order to produce the trench insulation, a mask 18 is then deposited on the substrate and/or in the first trench 19, and is subsequently structured (FIG. 1-5). This may be done, for example, using a suitable lithography technique. Methods such as these are known to those skilled in the art and do not need to be described any further here. After structuring the mask 18, a second trench 20 is etched by one or more etching methods (FIG. 1-6).

The second trench 20 has a trench insulation base 21, the first trench insulation wall 22a and further trench insulation walls 22b, of which only the first wall 22a and the wall 22b opposite it are shown in FIG. 1-6. The illustration in FIG. 1-6 does not show all the trench insulation walls. The first trench insulation wall 22a has a height H1. As is shown in FIG. 1-7, the second trench 20 is then subjected to thermal oxidation, as a result of which, the trench base 21 as well as the trench walls 22a, 22b are oxidized, provided that they are formed by the substrate 10, and an oxide layer is formed in these areas. This oxide layer forms trench insulation 23 that assists the subsequent deposition of silicon dioxide in the second trench 20. The trench insulation 23 is then planarized, with the mask 18 then being removed so that this results in the structure as shown in FIG. 1-8. FIG. 1-9 shows a section through the substrate along the line 1-9 from FIG. 1-8. FIG. 1-9 does not show the entire length L2 of the trench insulation 23. The method steps described so far result in a vertical transistor, which extends along the trench walls 14a, 14c and 14d, being produced in the substrate 10. The second trench wall 14b of the first trench 19 is formed in the region of the length L3 by means of a subregion of the first trench insulation wall 22a.

The first source/drain edge 24 is formed on the cut surface between the second trench wall 14b, or the first trench insulation wall 22a, and the first trench wall 14a. The second source/drain edge 25 is formed in a corresponding manner on the cut surface between the second trench wall 14b or the first trench insulation wall 22a and the trench wall 14c. The first gate electrode edge 29 is defined by that area in which the sacrificial gate oxide 16 and the sacrificial gate electrode 17 are bounded by the second trench wall 14b of the first trench. A corresponding situation applies to the second gate electrode edge 30.

FIG. 1-9 includes a separate enlarged view of the area that is enclosed by the dashed circle. This enlargement shows that the first gate electrode edge 29 produced in this way is not a sharply defined essentially rectangular edge but that, because of the thermal oxidation of the second trench 20 on the boundary surface between the sacrificial gate electrode 17 and the sacrificial gate oxide 16, what is referred to as a bird's beak 26 is formed. Since it has surprisingly been found in the course of the present invention that the formation of such a bird's beak has a disadvantageous effect on the current/voltage characteristic of the vertical transistor, both the sacrificial gate electrode 17 and the sacrificial gate oxide 16 are removed from the first trench 19.

The first trench 19 that is now provided has a shorter length than the originally structured first trench 19, since the second trench wall 14b is formed by a subregion of the first trench insulation wall 22a. The sacrificial gate electrode 17 may, for example, be removed by a suitable chemical/physical dry etching method, for example using etching gases containing fluorine or chlorine. Wet chemical etching, preferably using an etching liquid containing hydrofluoric acid, is used to remove the sacrificial gate oxide 16. This isotropic etching also results in part of the trench insulation 23 (which, like the sacrificial gate oxide 16 is likewise composed of silicon dioxide) being removed in the area of the second trench wall 14b, as well. Since the etching process is carried out isotropically, the first and the second source/drain edges 24, 25 are exposed by this etching process. Once the sacrificial gate oxide 16 and the sacrificial gate electrode 17 have been removed, the gate oxide 27 is produced in a next step, which is illustrated in FIG. 1-11, by thermal oxidation on the trench walls 14a, 14c and 14d. To do this, it may once again be necessary to use an appropriate mask to protect those parts of the substrate which are not intended to be oxidized. This mask can then be removed. The gate electrode 28 is then structured, as already described with reference to FIG. 1-4. FIG. 1-13 shows a section through the substrate along the line 1-13 in FIG. 1-12. The isotropic etching of the sacrificial gate oxide 16 results in the vertical transistor together with its second trench wall 14b being pushed into the previously structured trench insulation, with the second trench wall 14b now having a length L4, which is longer than the original length L3, as a result of the isotropic etching. That area of the vertical transistor that is annotated using the dashed circle is shown enlarged in the second circle in FIG. 1-13. As can be seen from this enlargement, the first gate electrode edge 29 has been passed around the first source/drain edge and has a very narrow internal angle α, which is considerably less than 90°. This shape of the first gate electrode edge 29 is achieved by the combination of the isotropic etching of the sacrificial gate oxide 16 and the subsequent production of the gate oxide 27 by thermal oxidation. The described shape of the gate electrode results in this vertical transistor having a pronounced corner effect, which considerably improves its current/voltage characteristic. Finally, contact is made with the upper and the lower source/drain regions 11, 12, as is shown in FIG. 1-14. To do this, a second insulating layer 31 is deposited on the substrate surface and in the first trench 19, with this second insulating layer at the same time having a planarizing effect.

A suitable photolithographic method may now be used to structure contact holes in the phosphor glass layer, and then to fill them with an electrically conductive material, thus forming the first contact 32 and the second contact 33.

FIG. 2-1 to 2-7 show a further embodiment of the method, in which the vertical transistor forms a part of a DRAM memory cell.

FIG. 2-1 shows a substrate 10, for example, a boron-doped monocrystalline silicon, in which a number of energy storage capacitors have already been structured. The energy storage capacitors have not been formed completely in FIG. 2-1. Only the upper area of the energy storage capacitors is shown. The inner electrode 34 of the energy storage capacitors is isolated from the substrate 10 by the insulator collar 35. There is an adjacent contact area above the insulator collar 35, which is bounded at the top by the first insulation layer 15 that is deposited on the trench base 13 of the first trench 19. The contact area ensures an electrical connection between the lower source/drain region 11 and the inner storage electrode 34. As is shown partially in FIG. 2-1, the sacrificial gate oxide 16 and the sacrificial gate electrode 17 have already been produced in the first trench 19 with the trench walls 14a to 14d. The upper source/drain region 12 has been produced in the substrate 10, for example, by a suitable doping process, on the substrate surface, adjacent to the sacrificial gate oxide 16. Conventional methods which are known to those skilled in the art and which in some cases have already been partially described in conjunction with the already described embodiments of the present invention can be used to produce the structures shown in FIG. 2-1.

FIG. 2-2 shows a section through the substrate 10, along the line 2-2 from FIG. 2-1. As can be seen from FIG. 2-2, the basic outline of the first trench 19, which at this time is filled by the sacrificial gate electrode 17 and the sacrificial gate oxide 16, is rectangular, so that the first trench 19 includes the first trench wall 14a, the trench wall 14c opposite it, the second trench wall 14b and the trench wall 14d opposite it. As can also be seen from FIG. 2-2 the trench insulation 23 has been structured along the trench walls 14b and 14d. The structuring of the trench insulation 23 may in this case be carried out as has already been described in conjunction with the first embodiment of the present invention.

In FIG. 2-2 the first and the second source/drain edges 24/25 are likewise defined by the first trench wall 14a and the first trench insulation wall 22a of the respective trench insulation 23. The first and second gate electrode edges 29, 30 are defined in a corresponding manner by the second trench wall 14b and the trench wall 14d opposite it, and by the boundary surface between the sacrificial gate oxide 16 and the sacrificial gate electrode 17.

FIG. 2-2 shows a dashed circle with a region of the vertical transistor and shows an enlarged view of that region in a second circle. The enlargement once again shows that the thermal oxidation for producing the sacrificial gate oxide means that a sharp, that is to say essentially right-angled, first gate electrode edge 29 is not formed, but that a bird's beak 26 is formed here. In order to avoid the disadvantageous effects associated with this, the sacrificial gate electrode 17 and the sacrificial gate oxide 16 are removed from the first trench 19 in a subsequent step, which is shown in FIG. 2-3. This can once again be accomplished by a chemical/physical etching method for the sacrificial gate electrode 17. On the other hand, the sacrificial gate oxide 16 is once again removed by isotropic, wet-chemical etching.

As has already been described in conjunction with the first embodiment of the method, the first and the second source/drain edges 24, 25 are exposed by the isotropic wet chemical etching, since, in this case as well, the etching results in the removal of an area adjacent the second trench wall 14b, with a length L4 which is longer than the original length L3 of the second trench wall 14b, of the trench insulation 23.

As is shown in FIG. 2-5, the gate oxide 27 is then produced by thermal oxidation of the corresponding trench walls of the first trench. As already described above, it may be necessary during the thermal oxidation process to use a suitable mask to protect those areas of the substrate which are not intended to be oxidized, and this mask can be removed after the oxidation. The first trench 19 is then filled with polysilicon, thus resulting in the production of the gate electrode 28.

FIG. 2-6 shows a section through the substrate along the line 2-6 in FIG. 2-5. That area which includes the first gate electrode edge 29 and the first source/drain edge 24 and which is bounded by the dashed circle is illustrated enlarged in the larger circle from FIG. 2-6.

Due to the isotropic etching of the sacrificial gate oxide 16 and the subsequent production of the gate oxide 27 by thermal oxidation of the substrate, the resultant gate electrode edge 29 likewise has an internal angle α of considerably less than 90°. In contrast to the already described embodiment of the method, the isotropic etching has been carried out here for a shorter time period, so that less material has been removed from the trench insulation 23 during the etching process and, in consequence, the first gate electrode edge 29 has not been passed around the first source/drain edge 24, but has just been shifted in the direction of the first source/drain edge 24. This geometry of the gate electrode edge 29 also results in a pronounced corner effect, which considerably improves the current/voltage characteristic of the vertical transistor.

Finally, further method steps, which do not need to be discussed in detail here, are used to complete the memory cell. For this purpose, as is illustrated in FIG. 2-7, the gate electrode is completed by varying the shape and by the addition of the barrier layer 36, for example, a tungsten nitride layer, the metal layer 37, which is for example, a tungsten layer, and the insulation cap 38. At the same time as the completion of the gate electrode structure, whirled lines which run past and are located above the upper source/drain regions can be structured, as well as the bit line 39 that is associated with the described memory cell. Conventional processes and methods which are known to those skilled in the art may be used for all of these structuring steps.

FIG. 3 in each case shows a current/voltage curve for a conventional vertical transistor and for a vertical transistor produced using the method, with the two vertical transistors having the structure shown in FIGS. 2-1 to 2-7. The conventional vertical transistor has the bird's beak between its gate oxide and its gate electrode while, in contrast, the vertical transistor constructed according to the invention has the described, considerably more pointed, gate electrode edge without any bird's beak.

As can be seen from the curves in FIG. 3, both the vertical transistors have a comparable, very low residual current when switched off. In contrast to the conventional transistor, the transistor constructed according to the invention has a considerably steeper drop in the current level as the voltage on the gate electrode decreases. The vertical transistor produced according to the invention thus has a considerably improved so-called sub threshold slope.

The current/voltage curves illustrated in FIG. 3 also show that the vertical transistor produced according to the invention has a considerably higher so-called on current when switched on.

We claim:

1. A method for producing a vertical transistor having a gate electrode, a gate oxide, an upper source/drain region, and a lower source/drain region, the method which comprises:
    producing at least one first trench in a substrate with a substantially vertical substrate edge;
    producing a sacrificial gate oxide on at least a first trench wall;
    producing a sacrificial gate electrode on the sacrificial gate oxide;
    producing an insulation structure for insulation between different vertical transistors;
    removing the sacrificial gate electrode from the trench;
    removing the sacrificial gate oxide from the trench;
    at least at a location of the sacrificial gate oxide, producing the gate oxide on the trench wall;
    producing the gate electrode on the gate oxide, the gate oxide insulating the gate electrode from the substrate, the insulating structure bounding the gate electrode in a region in which the gate oxide covers the substantially vertical substrate edge, and the gate electrode forming an angle α of 90° or less with the insulating structure; and
    producing the upper source/drain region and the lower source/drain region.

2. The method according to claim 1, wherein the step of removing the sacrificial gate oxide is carried out by an isotropic etching.

3. The method according to claim 1, wherein the step of removing the sacrificial gate oxide is carried out by a wet-chemical etching.

4. The method according to claim 1, which comprises using trench insulation as the insulation structure.

5. The method according to claim 4, which comprises:
    producing at least one second trench for generating the trench insulation; and
    filling the second trench with an insulating material such that a first trench insulation wall forms an edge with the first trench wall.

6. The method according to claim 5, which comprises, during the step of removing the sacrificial gate oxide, removing the insulating material from the trench insulation in a region of the first trench insulation wall such that at least one substrate edge is exposed.

7. The method according to claim 6, wherein the gate oxide is also applied to the substrate edge.

8. The method according to claim 6, which comprises forming a gate electrode having an internal angle α of 90° or less with the first trench insulation wall.

9. The method according to claim 1, which comprises, before performing the step of producing the sacrificial gate oxide, producing an insulation layer on a base of the first trench.

10. The method according to claim 9, wherein the insulation layer is a silicon nitride layer.

11. The method according to claim 1, which comprises performing at least one step selected from a group consisting of the step of producing the sacrificial gate oxide and the step of producing the gate oxide by a thermal oxidation.

12. The method according to claim 1, wherein the insulating structure includes an insulating material produced from silicon dioxide.

13. The method according to claim 1, which comprises using polysilicon as a material of at least one electrode selected from a group consisting of the sacrificial gate electrode and the gate electrode.

14. The method according to claim 1, wherein the vertical transistor is produced over an energy storage capacitor and forms a part of a memory cell.

15. The method according to claim 1, wherein the vertical transistor forms a part of a DRAM memory cell.

16. A vertical transistor, comprising:
   at least one trench wall;
   a plurality of source/drain regions;
   a channel region running essentially vertically on said trench wall;
   a gate electrode;
   a gate oxide insulating said gate electrode from said channel region;
   at least one insulation structure for insulating between different vertical transistors; and
   a substantially vertical substrate edge;
   said insulation structure bounding said gate electrode in a region in which said gate oxide covers said substantially vertical substrate edge; and
   said gate electrode having an internal angle α of 90° or less with said insulation structure.

17. The vertical transistor according to claim 16, wherein said insulation structure is trench insulation.

18. The vertical transistor according to claim 16,
   wherein said insulation structure is trench insulation; and
   said gate electrode at least partially covers said gate oxide in a region of said substantially vertical substrate edge.

19. The vertical transistor according to claim 16, wherein said gate electrode forms an internal angle α of 60° or less with said insulation structure.

20. The vertical transistor according to claim 16, in combination with a memory cell, wherein said memory cell includes an energy storage capacitor and said vertical transistor is formed above said storage capacitor.

* * * * *